US011492961B2

(12) United States Patent
Sarder et al.

(10) Patent No.: US 11,492,961 B2
(45) Date of Patent: Nov. 8, 2022

(54) STANDBY GENERATOR CONTROL AND ACCESS PANEL

(71) Applicant: Champion Power Equipment, Inc., Santa Fe Springs, CA (US)

(72) Inventors: Mark J. Sarder, Waukesha, WI (US); Russell J. Dopke, Elkhart Lake, WI (US); Hiroaki Sato, Brookfield, WI (US); Leigh A. Jenison, Hartland, WI (US)

(73) Assignee: Champion Power Equipment, Inc., Sante Fe Springs (CA)

( * ) Notice: Subject to any disclaimer, the term of this patent is extended or adjusted under 35 U.S.C. 154(b) by 734 days.

(21) Appl. No.: 16/378,693

(22) Filed: Apr. 9, 2019

(65) Prior Publication Data

US 2019/0338700 A1 Nov. 7, 2019

Related U.S. Application Data

(60) Provisional application No. 62/667,747, filed on May 7, 2018.

(51) Int. Cl.

*H02G 3/08* (2006.01)
*H05K 5/00* (2006.01)
*F02B 63/04* (2006.01)

(52) U.S. Cl.

CPC ...... *F02B 63/044* (2013.01); *F02B 2063/045* (2013.01)

(58) Field of Classification Search

CPC ...... H01R 13/53; H01R 13/533; H01R 13/46; H02G 3/08; H02G 3/081; H05K 5/00; H05K 5/03; H05K 5/02; H05K 5/04; F02B 63/044; F02B 63/048; F02B 63/04; F02B 2063/045

USPC ........ 174/50, 559, 520, 17 R, 50.5; 361/600, 361/601, 602, 603, 641, 679.01; 310/89

See application file for complete search history.

(56) References Cited

U.S. PATENT DOCUMENTS 4,608,946 A 9/1986 Tanaka et al.
4,702,201 A 10/1987 Odo et al.
5,899,174 A 5/1999 Anderson et al.
6,028,369 A 2/2000 Hirose et al.
6,227,890 B1 * 5/2001 Roper, Jr. .......... H01R 13/6397 361/641
6,331,740 B1 12/2001 Morohoshi et al.
6,376,944 B1 4/2002 Grizzle, Jr. et al.
6,489,690 B1 12/2002 Hatsugai et al.
6,784,574 B2 8/2004 Turner et al.
(Continued)

FOREIGN PATENT DOCUMENTS

CN 1800600 A 7/2006
CN 2890369 Y 4/2007
(Continued)

*Primary Examiner* — Angel R Estrada

(74) *Attorney, Agent, or Firm* — Ziolkowski Patent Solutions Group, SC

(57) ABSTRACT

A control system for a standby generator includes a control box mounted in a standby generator enclosure with a control panel coupled to the control box that is selectively openable to provide access into the control box. One or more fasteners may be mounted to the control panel to selectively hold the control panel closed, and one or more generator control components may be mounted in the control box and operated by the control panel.

26 Claims, 8 Drawing Sheets

(56) References Cited

U.S. PATENT DOCUMENTS

| | | | | |
|---|---|---|---|---|
| 6,825,573 | B2 | 11/2004 | Suzuki et al. | |
| 6,975,042 | B2 | 12/2005 | Yamada et al. | |
| 7,537,070 | B2 | 5/2009 | Maslov et al. | |
| 7,642,665 | B2 | 1/2010 | Konop et al. | |
| 7,705,478 | B2 * | 4/2010 | Hirose | F02B 63/04 290/1 A |
| 8,450,863 | B2 * | 5/2013 | Farr | H02B 1/00 361/600 |
| 8,559,167 | B1 * | 10/2013 | Czarnecki | H02B 1/46 361/647 |
| 8,899,191 | B2 | 12/2014 | Yano et al. | |
| 9,252,534 | B2 * | 2/2016 | Richards | H01R 13/629 |
| 9,431,865 | B2 * | 8/2016 | Janscha | F01N 13/08 |
| 9,617,951 | B2 | 4/2017 | Sotiriades et al. | |
| 9,995,211 | B2 * | 6/2018 | Schmit | F02B 63/044 |
| 10,181,770 | B2 * | 1/2019 | Janscha | A47B 81/00 |
| 10,907,527 | B2 * | 2/2021 | Sarder | F01P 1/00 |
| 11,143,099 | B2 * | 10/2021 | Sarder | F01P 11/10 |
| 2002/0000342 | A1 | 1/2002 | Yamada et al. | |
| 2013/0187392 | A1 | 7/2013 | Janscha et al. | |
| 2016/0233739 | A1 | 8/2016 | Jenison et al. | |
| 2016/0294255 | A1 | 10/2016 | Schmit et al. | |
| 2016/0319728 | A1 | 11/2016 | Jenison et al. | |

FOREIGN PATENT DOCUMENTS

| | | | |
|---|---|---|---|
| CN | 204024810 | U | 12/2014 |
| CN | 104314676 | A | 1/2015 |

* cited by examiner

STANDBY GENERATOR CONTROL AND ACCESS PANEL

CROSS-REFERENCE TO RELATED APPLICATION

The present application is a non-provisional of, and claims priority to, U.S. Provisional Patent Application Ser. No. 62/667,747, filed May 7, 2018, the disclosure of which is incorporated herein by reference in its entirety.

BACKGROUND OF THE INVENTION

Embodiments of the invention relate generally to standby generators and, more particularly, to a control box mounted in a standby generator enclosure having improved access to electrical components within the control box.

Standby generators provide a convenient source of backup power for use when outages occur in the utility grid. Standby generators typically contain a prime mover that drives an alternator or other electrical generator to produce electricity for distribution from the standby generator. The prime mover can be provided by an internal combustion engine configured to operate on a fuel source supplied from a fuel tank or a fuel line. The internal combustion engine has a crankshaft that is coupled to drive the alternator. The alternator generates electrical power that can be distributed to an electrical panel of a home, building, etc. An automatic transfer switch can be used to sense an electrical power interruption in the utility grid and automatically engage backup power from the standby generator to the home or building.

Standby generators typically contain a generator enclosure to house the internal combustion engine, alternator, control systems, and other generator components. The generator enclosure shields the standby generator from weather conditions, provides noise insulation, and protects people and animals from electrical and mechanical hazards within the enclosure. Generator enclosures typically have a means of access into the enclosure for installation and maintenance. For instance, generator enclosures may include doors that open to access the control systems or to perform scheduled maintenance. Generator enclosures may also include one or more access panels that are removable to gain entrance to locations within the enclosure not readily accessible through the doors.

Standby generators are often located adjacent a home or building with a power distribution line connecting the generator to the home or building. Unfortunately, installing the power distribution line in the generator can be time consuming and dangerous due to space limitations between the generator and the home or building. For instance, some standby generators require disassembly of an access panel in a back wall of the generator enclosure to install the power distribution line. The access panel may require time consuming disassembly, and limited space behind the generator may restrict access into the generator enclosure. A person installing the distribution line may be required to reach far into the enclosure while assuming a posture that is awkward and unsafe. Further, connection terminals for the power distribution lines may be located out of sight behind other generator components and with limited space for tools. In some cases, installing a distribution line in a generator enclosure may require two or more people working from both a front and a back of the generator.

Therefore, it would be desirable to provide a standby generator having a generator enclosure that provides improved access into the enclosure and reduces the time required for installation and maintenance. It would be further desirable to provide a control box mountable in the generator enclosure with improved access to connect electrical distribution lines to connection terminals in the control box.

BRIEF DESCRIPTION OF THE INVENTION

Embodiments of the invention are directed to a control box for a standby generator having a control panel that opens to provide convenient access to control components located within the control box.

In accordance with one aspect of the invention, a control system for a standby generator includes a control box mounted in a standby generator enclosure with a control panel coupled to the control box that is selectively openable to provide access into the control box. One or more fasteners may be mounted to the control panel to selectively hold the control panel closed, and one or more generator control components may be mounted in the control box and operated by the control panel.

In accordance with another aspect of the invention, an electrical enclosure that houses one or more generator control components of a generator includes a plurality of side panels, a bottom panel coupled to the plurality of side panels, and an enclosure cover hinged to one or more of the bottom panel and plurality of side panels. The enclosure cover rotates between an open position and a closed position, so as to provide selective access to an interior of the electrical enclosure. A microswitch preferably couples to the enclosure cover to electrically disengage at least one of the one or more generator control components when the enclosure cover is in the open position.

In accordance with yet another aspect of the invention, a standby generator includes a standby generator enclosure having a base, a back wall extending generally vertically from the base, and first and second sidewalls each extending generally vertically from opposite ends of the base. The standby generator also includes an engine-generator set mounted to the base, and a control system to control operation of the engine-generator set that mounts proximate the back wall within the standby generator enclosure. The control system includes a control box that houses generator control components therein, and a control box cover hinged to the control box to rotate between a closed position and an open position. The control box cover may cover a top portion of the control box when in the closed position and uncover the top portion when in the open position, so as to provide selective access into the control box.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

The operating environment of the invention is described with respect to a standby generator. However, those skilled in the art will appreciate that the invention is equally applicable for use with portable or other electrical generators. While the invention will be described with respect to a standby generator having a multi-chamber generator enclosure, embodiments of the invention are equally applicable for use with single-chamber or other types of generator enclosures.

Figure 1:
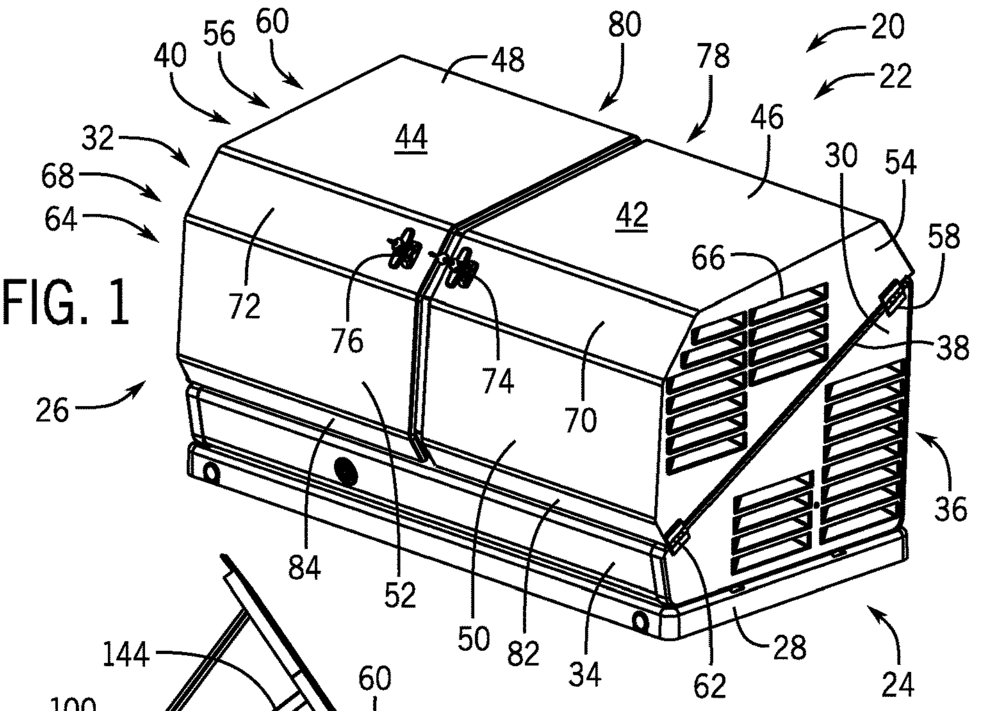
FIG. 1 is a perspective view from the right upper side of an electrical generator, according to an embodiment of the invention.

Referring to FIG. 1, a standby generator 20 is shown, in accordance with an embodiment of the invention. The standby generator 20 produces electrical energy and may deliver the electrical energy to a distribution panel of a home, office, shop, business or any other building requiring electricity. The standby generator 20 may include an internal combustion engine, an alternator driven by the internal combustion engine, and other associated components. The internal combustion engine operates on a fuel source that may include gasoline, diesel, liquefied petroleum gas (LPG), propane, butane, natural gas, or any other fuel source suitable for operating the engine. For instance, the internal combustion engine may comprise a single fuel engine configured to operate on one of the fuels. Alternatively, the engine may comprise a dual fuel or multi-fuel engine configured to switch operation between two or more of the fuel sources. In one embodiment, the engine may comprise a dual fuel engine configured to switch operation between LPG and gasoline, or LPG and diesel. The alternator and engine may form an engine-generator set used to produce electricity for distribution from the standby generator 20.

The standby generator 20 may include a standby generator enclosure 22 to house the engine-generator set and other associated components. In the embodiment of FIG. 1, the engine-generator set is positioned in a horizontal crankshaft arrangement with the alternator located toward a first end 24 of the enclosure 22 and the engine located toward a second end 26 of the enclosure 22. The standby generator enclosure 22 may include a base 28 to support the engine-generator set. The enclosure 22 may also have a first sidewall 30 and a second sidewall 32 each extending generally vertically from opposite ends of the base 28 at the first end 24 and the second end 26 of the enclosure 22, respectively. The enclosure 22 may also include a front wall 34 and a back wall 36 extending generally vertically from the base 28 between the first sidewall 30 and the second sidewall 32, with the front wall 34 and the back wall 36 defining a front and a back of the standby generator 20. The front wall 34 and the back wall 36 may be angled slightly from vertical such that each has a bottom portion positioned slightly inward from a corresponding top portion. The first sidewall 30 and the second sidewall 32 may each have a respective top edge 38, 40 that generally slopes diagonally from a taller back wall 36 to a shorter front wall 34.

The enclosure 22 may also include one or more hoods to cover the standby generator 20. The embodiment shown in FIG. 1 has a first hood 42 and a second hood 44, also referred to as doors, coupled to a respective first sidewall 30 and second sidewall 32. The first hood 42 and the second hood 44 may each have a top panel 46, 48, a front panel 50, 52, and a side panel 54, 56 with the side panels generally perpendicular to the respective top and front panels. The side panels 54, 56 of each hood 42, 44 may each be a coupled to a respective one of the first sidewall 30 and the second sidewall 32 of the enclosure 22 using a first hinge 58, 60 and a second hinge 62, 64. The side panels 54, 56 may include vents 66, 68 with louvers, and vents may be formed in the first sidewall 30 and the second sidewall 32. The top panels 46, 48 are preferably sloped downward toward the front of the enclosure 22 and the front panels 50, 52 may slope forward toward the base 28 of the enclosure 22 to enhance water runoff.

Each hood 42, 44 may also have a front transition panel 70, 72 between the respective top panel 46, 48 and the front panel 50, 52. The front transition panels 70, 72 further encourage water runoff and add to an aesthetically pleasing design. A handle 74, 76 may be attached to the front transition panel 70, 72 of each hood 42, 44 for opening the hoods and exposing internal components of the standby generator 20. The front transition panels 70, 72 are designed so the handles 74, 76 enhance accessibility by directionally facing a person standing in front of the enclosure 22 when the hoods 42, 44 are closed. Each hood 42, 44 may also have a rear transition panel 78, 80 that slopes downward from the respective top panel 46, 48 toward the back wall 36 when the hoods are closed. Each hood 42, 44 may also have a lower transition panel 82, 84 that slopes inward from the respective front panel 50, 52 toward the front wall 34 when the hoods are closed. The rear transition panels 78, 80 and the lower transition panels 82, 84 further encourage water runoff and add to an aesthetically pleasing design.

Figure 2:
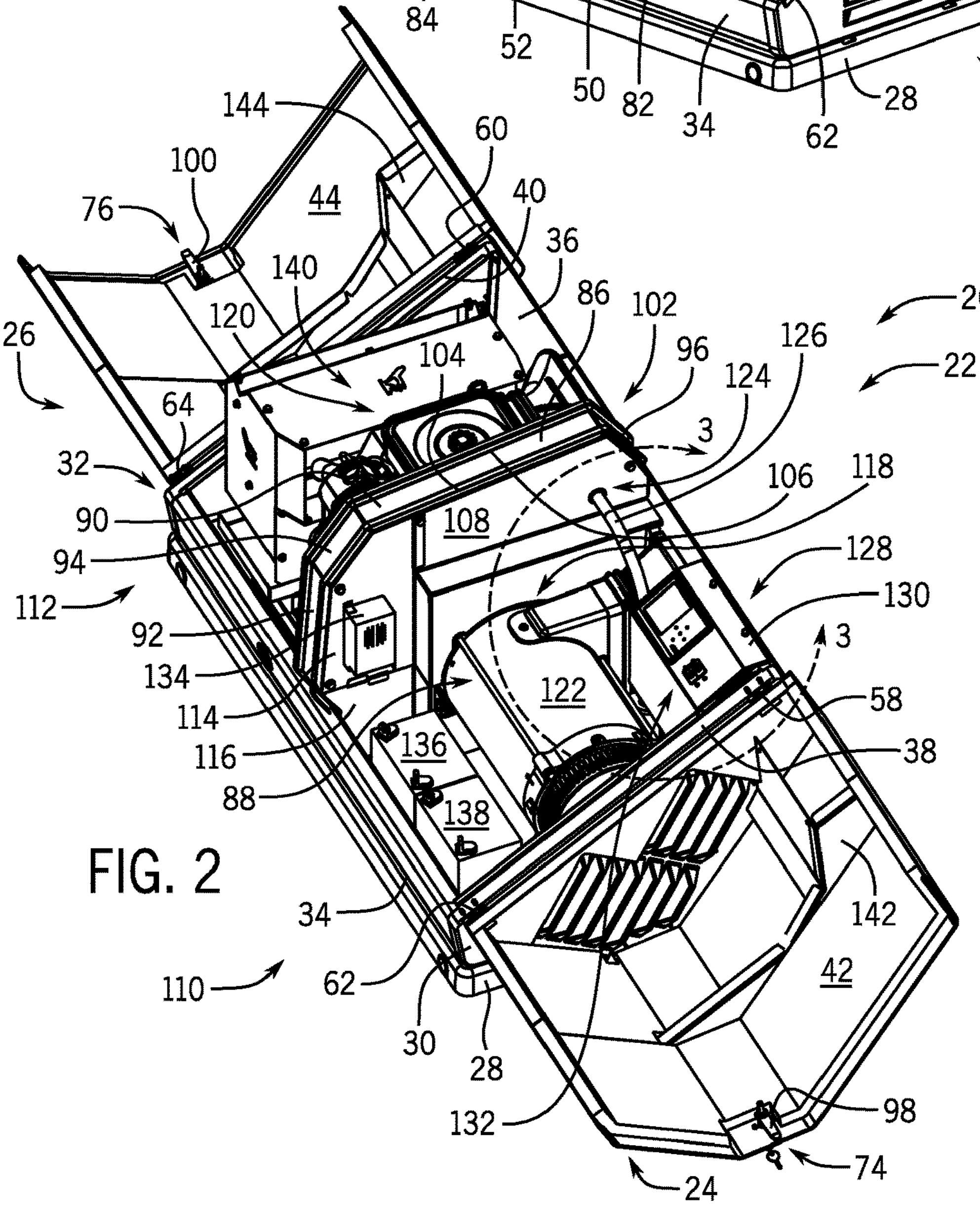
FIG. 2 is a perspective view similar to FIG. 1 with left and right doors opened to expose electrical generator components within, according to an embodiment of the invention.

Referring now to FIG. 2, standby generator 20 is shown having the first hood 42 and the second hood 44 in an open position, in accordance with an embodiment of the invention. As indicated previously, the first hood 42 and the second hood 44 may be coupled to a respective sidewall 30, 32 using first hinge 58, 60 and second hinge 62, 64 with the first hinge near the back of the enclosure 22 and the second hinge near the front of the enclosure 22. The first hood 42 may be hinged to the enclosure 22 to rotate over a top of the first sidewall 30 and the second hood 44 may be hinged to the enclosure 22 to rotate over a top of the second sidewall 32. The first hood 42 and the second hood 44 may rotate about an upper or top edge 38, 40 of the respective sidewall 30, 32 beyond the first end 24 and the second end 26 of the enclosure 22 in a "gull wing" configuration for ease of access and serviceability to the generator. The "gull wing" configuration may allow the hoods 42, 44 to open without contacting a home, office, shop, business, or any other building requiring electricity located behind the standby generator 20.

The first hood 42 and the second hood 44 may open outwards beyond the respective first sidewall 30 and second sidewall 32 to expose a top and front entrance into the enclosure 22. The front wall 34 may be relatively short compared to the overall height of the enclosure 22 in part to allow for improved front access into the enclosure 22 when the hoods 42, 44 are open. The back wall 36 may be relatively tall compared to the front wall 34 with the first sidewall 30 and the second sidewall 32 having forward sloping top edge 38, 40 from the back wall to the front wall. The first hood 42 and the second hood 44 can then open upward and slightly forward as they rotate along the forward sloping top edge 38, 40 of each respective sidewall 30, 32. In other embodiments, the first hood 42 and the second hood 44 may rotate about a horizontal or vertical edge of a respective first sidewall 30 and second sidewall 32 between opened and closed positions.

FIG. 2 also shows a support arm 86 extending across a center of the enclosure 22 to support the first hood 42 and the second hood 44 in the closed position. The support arm 86 extends from the back wall 36 over an engine-generator set 88 to the front wall 34 in the enclosure 22. The support arm 86 may have a top panel 90, a front panel 92, a front transition panel 94, and a rear transition panel 96 to match the first hood 42 and the second hood 44. Accordingly, the support arm 86 may have a geometry the matches the first hood 42 and the second hood 44 to ensure the hoods close tightly against the support arm. The support arm 86 may also receive a latch 98, 100 from each handle 74, 76 to hold the first hood 42 and the second hood 44 closed.

The support arm 86 preferably has a channel or gutter 102 extending the length of the support arm to channel water between the hoods 42, 44 off the front or back of the enclosure 22. The gutter 102 may be formed by raised outer edges that include a first rain seal 104 and a second rain seal 106 on opposite sides of the support arm 86. The first rain seal 104 and the second rain seal 106 each support and seal a respective hood 42, 44 in the closed position. To seal around each perimeter entrance covered by the first hood 42 and the second hood 44, the first rain seal 104 and the second rain seal 106 may extend along top portions of the front wall 34, back wall 36, first sidewall 30, or second sidewall 32 in addition to the support arm 86. The rain seals 104, 106 prevent rain from entering the enclosure 22 and may make the enclosure 22 rain tight. Although some water may enter the enclosure 22 without negatively affecting the generator 20, it is desirable to prevent water from entering the electrical areas within the enclosure 22. The rain seals 104, 106 may allow electrical areas within the enclosure 22 to be rain tight.

The support arm 86 may couple to a partition wall 108 separating the enclosure 22 into a right chamber 110 and a left chamber 112. The partition wall 108 may extend from the back wall 36 to the front wall 34 with an upper partition wall 114 extending to the support arm 86 and a lower partition wall 116 extending to the base 28 of the enclosure 22. The partition wall 108 may have an opening 118 to receive an engine-generator set 88 mounted to the base 28. In this arrangement, the engine-generator set 88 may comprise an engine 120 coupled to drive an alternator 122 with the engine 120 extending into the left chamber 112 and the alternator 122 extending into the right chamber 110. That is, the partition wall 108 may cross the engine-generator set 88 to separate the alternator 122 from the engine 120 limiting heat and airflow from the engine to the alternator, thus allowing the alternator to operate at a reduced and more efficient temperature. The partition wall 108 may also include a fuel line opening 124 to receive a fuel line hose 126 that extends from the right chamber 110 to the engine 120 in the left chamber 112. The fuel line hose 126 may enter the right chamber 110 through an opening in the back wall 36.

The standby generator 20 may include a control system 128 to operate the generator. The control system 128 may include a control box 130, also referred to as an electrical enclosure, to receive generator control components 132 therein, as will be discussed further below. The control box 130 is shown mounted in the right chamber 110 behind the alternator 122 adjacent the back wall 36 in the generator enclosure 22. The control box 130 may extend vertically along the top half of the back wall 36 and horizontally from a left side of the alternator 122 to the first sidewall 30 with its length generally twice the size of its depth. The control system 128 may also include a battery charger 134 mounted on the partition wall 108 to charge a first battery 136 and a second battery 138 located on the base 28 in front of the alternator 122. A muffler 140 may be positioned in chamber 112 of the multi-chamber generator housing 22 separate from alternator 122.

As shown in FIG. 2, the first hood 42 and the second hood 44 may include one or more partition panels 142, 144 extending from a bottom surface of the hoods to compartmentalize portions of the generator enclosure 22. The partition panels 142, 144 can close around generator components to separate components in the enclosure 22, but also provide structural support for the hoods 42, 44. The partition panels 142 from the first hood 42 may fit around the control box 130 when the first hood is closed.

Figure 3:
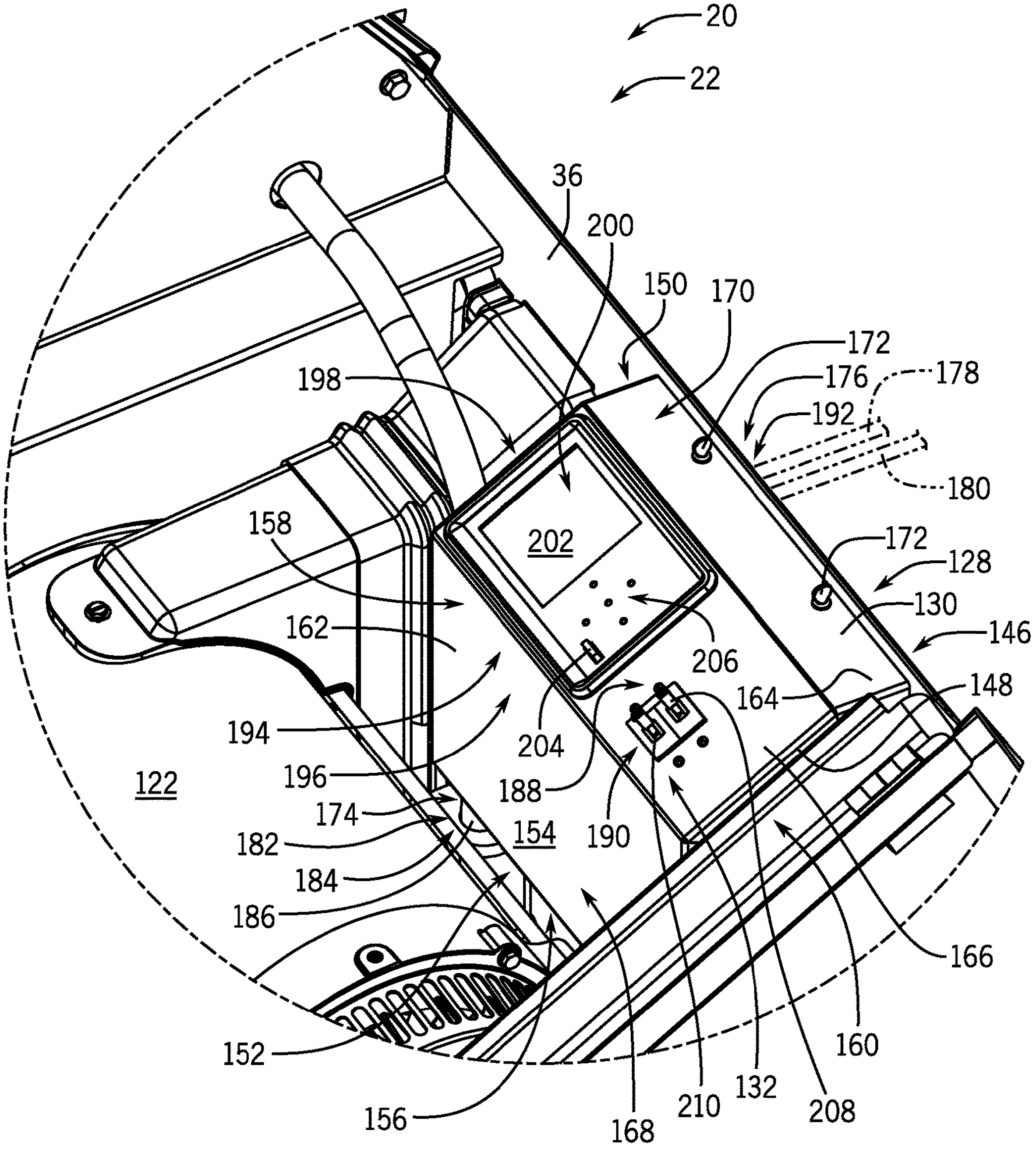
FIG. 3 is a detail view of the generator of FIG. 2 taken along line 3-3 of FIG. 2 showing a control box mounted to a back wall of the generator with distribution lines extending through the back wall, according to an embodiment of the invention.

Referring now to FIG. 3, the control box 130 is shown as having a back panel 146 mounted to the back wall 36 of the standby generator enclosure 22. The control box 130 may include a right panel 148 and a left panel 150 extending forward from the back panel 146, and a bottom panel 152 coupled to the right and left panels 148, 150 and the back panel 146. The right panel 148 and the left panel 150 may extend perpendicular from the bottom panel 152 and the back panel 146. Also, the bottom panel 152 may extend perpendicular from the back panel 146.

The control box 130 may have a control box cover 154, also referred to as an enclosure cover, that may open and close to provide selective access into the control box. The control box cover 154 may be hinged to a lower end 156 of the control box 130, and may cover a front 158 of the control box 130 opposite the back wall 36 of the generator enclosure 22 when in a closed position 160. When in the closed position, the control box cover 154 may include a front panel 162 extending upward from the bottom panel 152, and a top panel 164 extending forward from the back panel 146. An intermediate panel 166 may extend diagonally from the top panel 164 to the front panel 162 to face a person in front of the generator enclosure 22. As such, the control box cover 154 may cover a side 168 and a top 170 of the control box 130 when in the closed position 160. The top panel 164 may include one or more fasteners 172, also referred to as one or more latches, to secure the control box cover 154 to the back panel 146.

The control box 130 may also have one or more openings 174, 176, formed therein to accept one or more power distribution lines 178, 180, 182, 184 therethrough. The power distribution lines 178, 180, 182, 184 can deliver electrical power from the alternator 122 to an electrical panel of a home or building. Electrical conduit 186 may house power distribution lines 182, 184 leading from the alternator 122 to the control box 130. Power distribution lines 182, 184 may be routed from the electrical conduit 186 through the opening 174 in the bottom panel 152 to circuit breakers 188, 190 within the control box 130. Power distribution lines 178, 180 may also be routed through an opening 192 (see also FIGS. 4-6) in the back wall 36 of the generator and adjacent opening 176 (see also FIGS. 4-6) in the back panel 146 to the circuit breakers 188, 190. The power distribution lines 178, 180 may couple to the control system 128 through the back wall 36 of the generator enclosure 22 since the back wall is often located adjacent a home or building that requires electricity.

Generator control components 132 may be mounted within the control box 130. The generator control components 132 may include circuit breakers 188, 190, or other distribution line connectors, that connect distribution lines 178, 180 to the standby generator 20. The circuit breakers 188, 190 can electrically couple each distribution line 178, 180 extending through the back wall 36 to a respective distribution line 182, 184 from the alternator 122, and thereby operate to selectively control electrical power distribution from the standby generator 20. The generator control components 132 may also include an electronic control system 194 to set operating parameters of the standby generator 20. The electronic control system 194 may control electrical components of the standby generator 20, including other generator control components 132 within the control box 130. For instance, the generator control components 132 mounted in the control box 130 may include an automatic voltage regulator (AVR) and an engine controller operated by the electronic control system 194.

The control box cover 154 may comprise standby generator controls 196 for a person to control operating parameters of the standby generator 20, thus providing a control panel 198 for the control system 128. As such, the control box cover 154 may also be referred to as a control panel 198. One or more of the generator controls 196 may be mounted to an outer surface of the control box cover 154 to operate at least one of the one or more generator control components 132. For instance, the electronic control system 194 may comprise a feedback system 200 to display generator operating parameters. The feedback system 200 may include a display screen 202 having a liquid crystal display (LCD) with touch screen capability positioned on the intermediate panel 166, which can receive generator control inputs to operate generator control components 132. The intermediate panel 166 may also have push buttons 204 to receive generator control inputs and indicator lights 206 to display generator operating parameters. The circuit breakers 188, 190 may each comprise a respective operator switch 208, 210 located on an external surface of the control panel 198. Generator controls 196 may be located on any panel of the control box 130 and control box cover 154, but can be mounted to the intermediate panel 166 to face a person standing in front of the standby generator 20.

Figure 4:
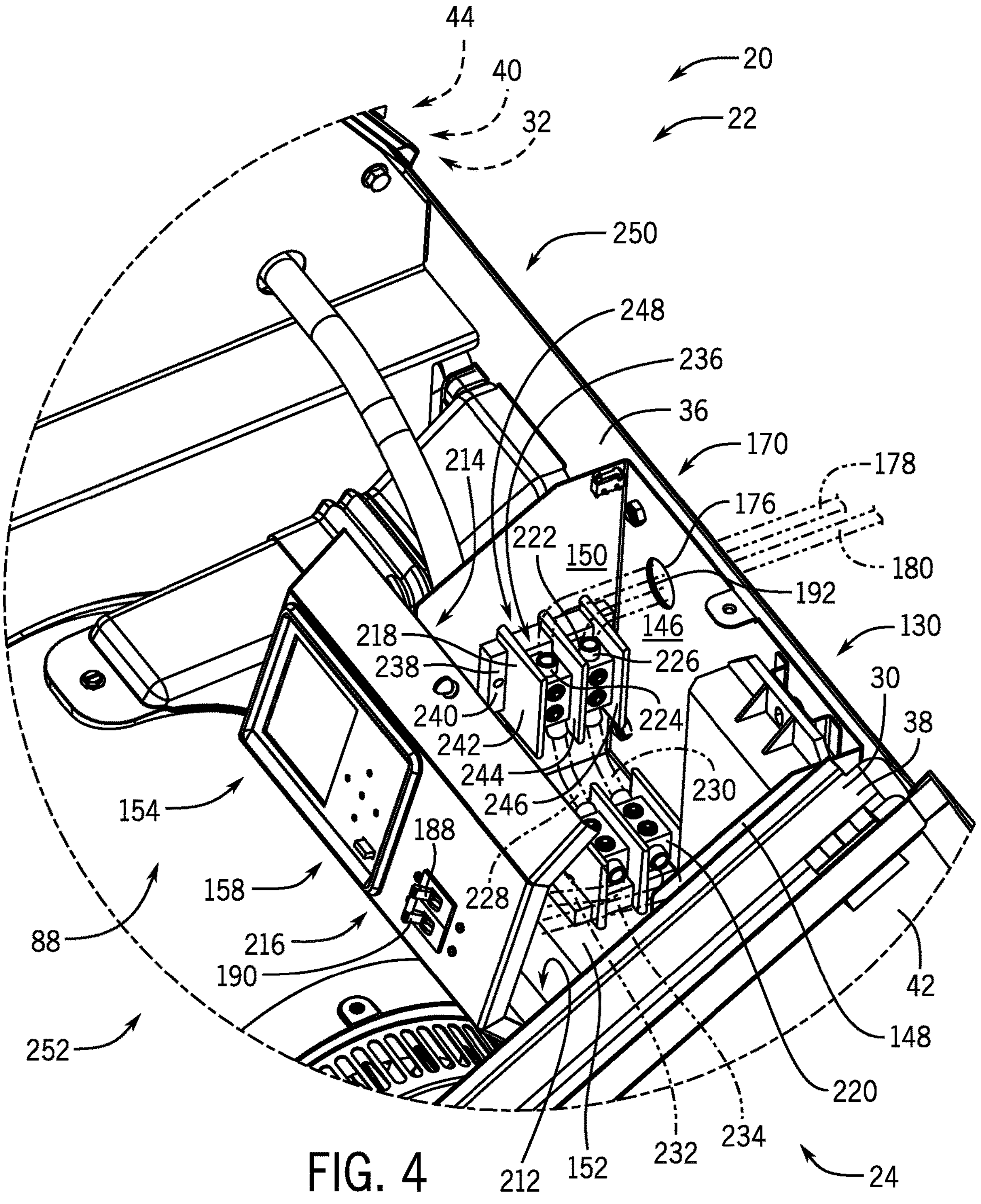
FIG. 4 is a detail view similar to FIG. 3 but having a single latch cover of the control box in an open position to access generator control components therein, according to an embodiment of the invention.

Referring now to FIG. 4, a detail perspective view shows the control box 130 with an open control box cover 154, in accordance with an embodiment of the invention. A first hinge 212 and a second hinge 214 may couple the control box cover 154 to the side panels 148, 150 of the control box 130. However, the control box cover 154 could be hinged directly to the bottom panel 152 or to a single side panel 148, 150. The control box cover 154 may be hinged to the control box 130 to rotate between a closed position 160 (FIG. 3) covering a top portion 170 of the control box 130 and an open position 216 uncovering the top portion 170 to provide selective access into the control box. The control box 130 may also open to uncover a front 158 entrance into the control box 130.

The back wall 36 of the generator enclosure 22 and the control box 130 may each comprise an opening 176, 192 formed therein to receive one or more distribution lines 178, 180 extending through the opening 192 formed in the back wall 36 and the opening 176 formed in the control box 130. Circuit breakers 188, 190 may be mounted in the control box 130 coupled to at least one of the one or more power distribution lines 178, 180. The control box 130 may further comprise one or more power distribution line connectors 218, 220, mounted therein to connect the one or more distribution lines 178, 180 to the engine-generator set 88. One distribution line connector 218 is shown mounted to the left panel 150 below the opening 176 in the back panel 146, and the other distribution line connector 220 is shown mounted to the bottom panel 152.

The distribution line connectors 218, 220 may each include connector blocks 222, 224 that couple distribution lines to the generator within the control box 130. FIG. 4 shows one embodiment where connector blocks 222, 224 include a pair of electrical connections 226, or sockets, to receive plugs from distribution lines. That is, the connector blocks 222, 224 may be rectangular blocks with an electrical connection 226 at each end to electrically couple two distribution lines together, although connector blocks 222, 224 may have 3, 4, 5, or any number of electrical connections to connect a corresponding number of distribution lines. The connector blocks 222, 224 may electrically couple the distribution lines 178, 180 extending through the back wall 36 to one or more intermediate distribution lines 228, 230, 232, 234 that can be electrically coupled to the circuit breakers 188, 190. The connector blocks 222, 224 may each have a support member 236 along their length that mounts to a connector base 238 of the distribution line connector 218, 220.

The connector base 238 may include a rectangular plate 240 having three fins 242, 244, 246 extending from the rectangular plate 240. The connector base 238 may receive the connector blocks 222, 224 between the fins 242, 244, 246 to mount in the control box 130. Fasteners can extend from the connector base 238 to openings for fasteners in the support member 236 of the connector blocks 222, 224, with the support member 236 mounted on a raised surface 248 between the fins 242, 244, 246. One connector block 224 can be mounted between a first fin 242 and a second fin 244 and another connector block 222 can be mounted between the second fin 244 and a third fin 246. The fins 242, 244, 246 can guide the connector blocks 222, 224 to mounting locations on the connector base 238. As such, the fins 242, 244, 246 may extend crosswise beyond the connector base 238 at both ends of the fins, and the tips of the fins 242, 244, 246 may be thinner than the base of the fins. The distribution line connectors 218, 220 are shown in FIG. 4 having two connector blocks 222, 224 each, but they may have any number of connector blocks including 1, 3, 4, etc.

As previously set forth, the standby generator enclosure 22 may include a first hood 42 and a second hood 44 that rotate over a forward sloping top edge 38, 40 of the first sidewall 30 and the second sidewall 32 to an open position. When rotated to the open position, the first hood 42 and second hood 44 expose a top 250 and a front 252 entrance into the standby generator 20. For example, the standby generator enclosure 22 may comprise a first hood 42 and a second hood 44 that allows connection of one or more distribution lines 178, 180 from a top 250 of the standby generator 20 when the first and second hoods are open and the control box cover 154 is open. FIG. 4 shows the first hood 42 opened beyond the first end 24 of the generator until it rests against the first sidewall 30 providing access to the control box 130 from a top 250 and a front 252 of the standby generator 20.

Accordingly, the power distribution lines 178, 180 can be installed within the control box 130 by first inserting the power distribution lines 178, 180 through the opening 192 in the back wall 36 and the opening 176 in the back panel 146 of the control box 130. A person installing the distribution lines 178, 180 can open the control box cover 154 and reach through the front 158 or top 170 entrance of the control box 130 to connect the power distribution lines 178, 180 to the distribution line connector 218. Since the first hood 42 may open beyond the first end 24 of the enclosure 22 to expose a top 250 entrance into the standby generator 20, a person can reach through the top 170 entrance of the control box 130 while standing behind the generator 20 and connect the distribution lines 178, 180 to the distribution line connector 218. Accessing the distribution line connectors 218, 220 through the opened control box cover 154 can reduce a need to remove an access panel from the back wall 36 of the standby generator 20, which can be a laborious process especially if the standby generator 20 is close to a home or building. Accordingly, the control box 130 can provide convenient and time saving installation procedures.

Figure 5:
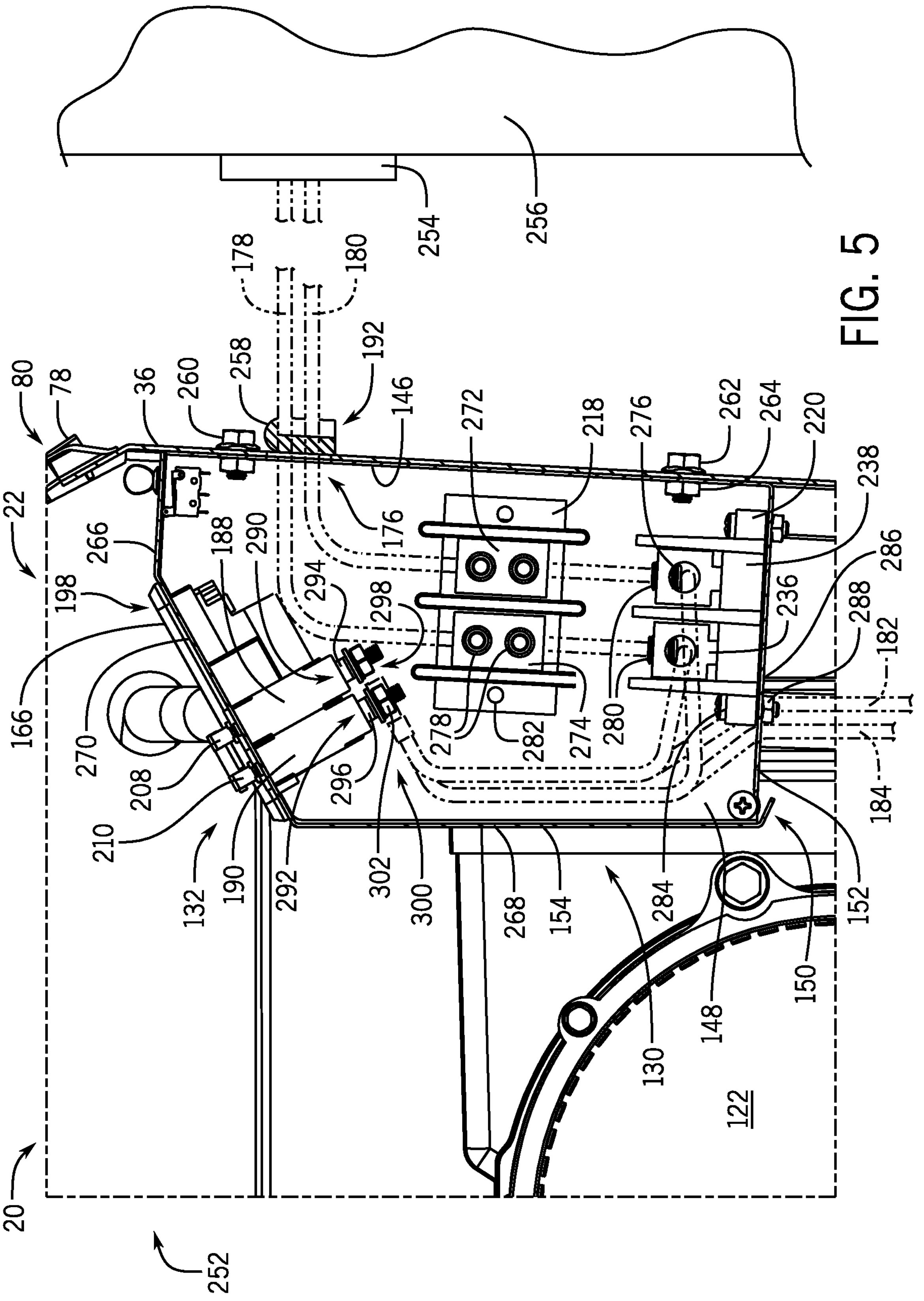
FIG. 5 is a detail partial cross-sectional view of the generator of FIG. 1 showing into a control box from a right side through a hidden right side panel of the control box with distribution lines coupled to the control box and to an electrical panel of a home or building, according to an embodiment of the invention.

Referring now to FIG. 5, distribution lines 178, 180 are shown extending from the standby generator 20 through the opening 192 in the back wall 36 to an electrical panel 254 of a home or building 256, in accordance with an embodiment of the invention. The back wall 36 may be tilted slightly such that the top of the back wall overhangs the bottom of the back wall. The tilted back wall 36 can improve water runoff from the rear transition panels 78, 80 of the hoods and prevent water from entering the opening 192 in the back wall 36. A rain deflector 258 is also shown around the opening 192 to prevent water entering the control box 130.

The control box 130 may be mounted to the back wall 36 by a pair of upper fasteners 260 and a pair of lower fasteners 262. Each pair of fasteners 260, 262 may comprise bolts or screws, for instance flange hex head screws. The back panel 146 of the control box 130 may comprise weld nuts 264 mounted in the control box 130 around openings to receive the fasteners 260, 262. The control box 130 may have a bottom panel 152 that is perpendicular to the back panel 146, and back wall 36, and therefore angles slightly upward toward the front 252 entrance into the enclosure 22. The right panel 148 and the left panel 150 may each have an upper edge 266 that extends generally perpendicular to the back wall 36 and a front edge 268 that extends generally vertically from the bottom panel 152. The right panel 148 and the left panel 150 may also have a forward transition edge 270 that slopes forward from the upper edge 266 to the front edge 268.

In contrast to the connector blocks 222, 224 of FIG. 4, the two distribution line connectors 218, 220 are shown in FIG. 5 having connector blocks 272, 274 configured to route the distribution lines 178, 180 from the opening 176 in the back panel 146 directly to the circuit breakers 188, 190. The routing connector blocks 272, 274 may be rectangular shaped blocks that each have an opening 276 extending lengthwise through the block to receive the distribution lines 178, 180 therethrough. The connector blocks 272, 274 may also have one or more openings 278 each to receive a set screw 280 that extends into a respective block to contact and secure a power distribution line 178, 180 in the connector block 272, 274.

The connector blocks 272, 274 may have a support member 236 along the length of each block that fastens to a respective connector base 238. Openings 282 may be provided in the ends of the connector base for fasteners 284 to mount the connector base 238 to the control box 130. The fasteners 284 may comprise bolts or screws, for instance cross slot screws. The fasteners 284 may extend through the openings 282 in the connector base 238 and received in corresponding openings 286 in the control box 130. Weld nuts 288 may be mounted around the openings 286 on an outer surface of the control box 130 to receive the fasteners 284. Thus, the distribution lines 178, 180 may be mounted in the control box 130 by the connector blocks 272, 274 and the connector base 238 of the respective distribution line connectors 218, 220.

Circuit breakers 188, 190 may be mounted to the control box 130 to electrically couple the power distribution lines 178, 180 to the standby generator 20. Circuit breakers 188, 190 may operatively couple the distribution lines 178, 180 extending through the back wall 36 directly to the distribution lines 182, 184 from the alternator 122 within the control box 130. Each circuit breaker 188, 190 may provide a power distribution line connector for the distribution lines 178, 180, 182, 184. The circuit breakers 188, 190 may be mounted to the intermediate panel 166 of the control box cover 154, and each circuit breaker 188, 190 may have a pair of contacts 290, 292 extending into the control box 130 with an operator switch 208, 210 on an outer surface of the control box 130.

Each pair of contacts 290, 292 may include a first terminal 294, 296 and a second terminal 298, 300, with FIG. 5 showing the first terminals in front of the second terminals. The distribution lines 178, 180 extending through the back wall 36 can couple to a different one of the first terminals 294, 296, and the distribution lines 182, 184 from the alternator 122 can couple to a different one of the second terminals 298, 300. For instance, one circuit breaker 188 may electrically couple a distribution line 180 extending through the back wall 36 to a distribution line 184 from the alternator 122, and the other circuit breaker 190 may electrically couple the other distribution line 178 extending through the back wall 36 to the other distribution line 182 from the alternator 122. The terminals 294, 296, 298, 300 may be threaded and the distribution lines 178, 180, 182, 184 may have ends that fit around the terminals secured by a nut 302.

The first and second terminals 294, 296, 298, 300 are electrically connected for each pair of contacts 290, 292 by operation of the respective operator switches 208, 210. Accordingly, the contacts 290, 292 may comprise one or more generator control components 132 mounted in the control box 130 and operated by switches 208, 210 of the control panel 198. The circuit breakers 188, 190 may be mounted within the control box 130 to break a circuit of the power distribution lines 178, 180 and selectively control electrical distribution from the standby generator 20 to the home or building. The switches 208, 210 may be coupled together outside of the control box 130 to operate in unison, and the circuit breakers 188, 190 may have any number of pairs of contacts 290, 292 and associated switches 208, 210 for a corresponding number of distribution lines.

Figure 6:
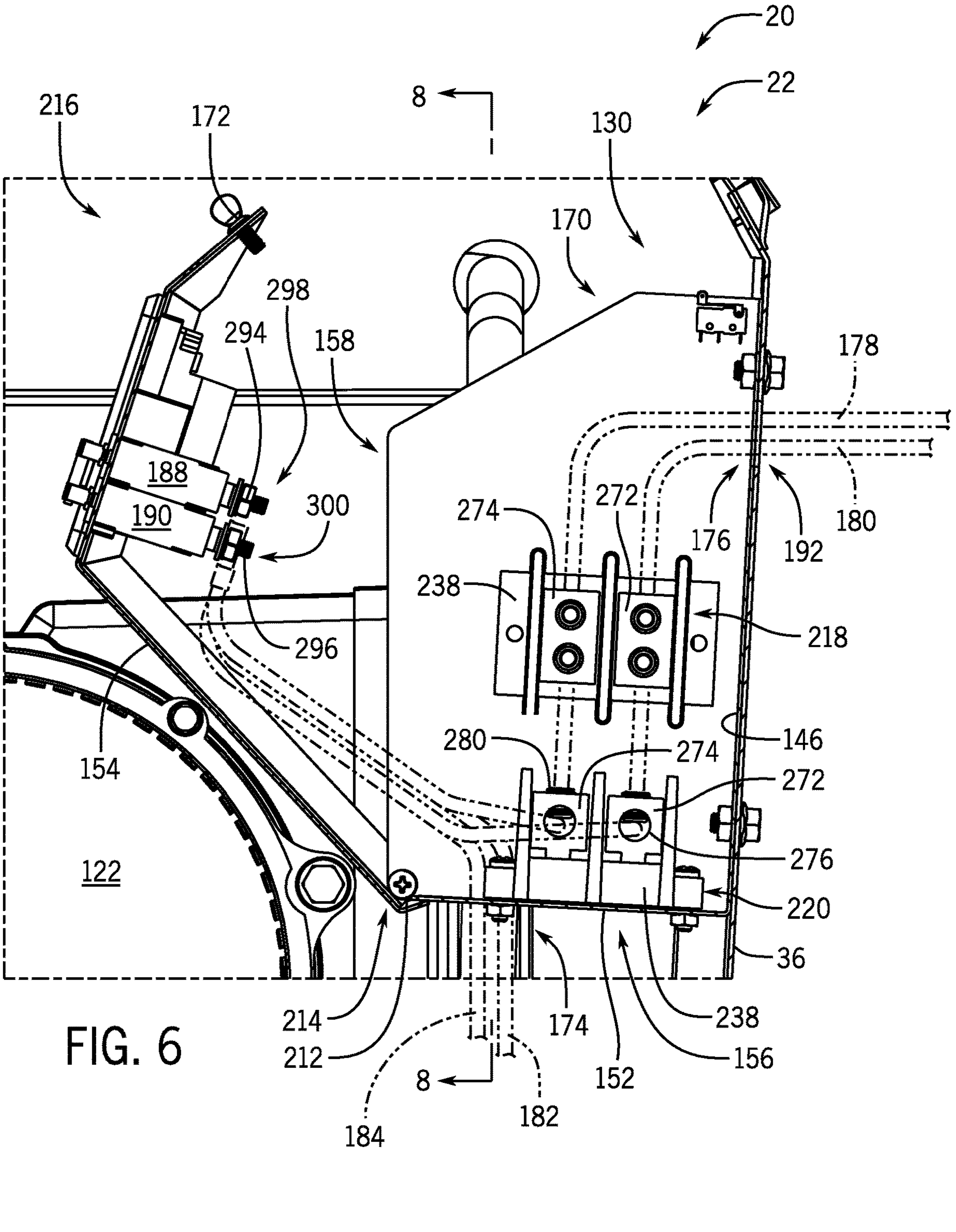
FIG. 6 is a detail partial cross-sectional view showing into a control box similar to FIG. 5 with a cover of the control box in an open position, according to an embodiment of the invention.

Referring now to FIG. 6, a side view of the control box 130 is shown with the control box cover 154 in an open position 216, in accordance with an embodiment of the invention. To install the distribution lines 178, 180 from a home or building in the standby generator 20, the first hood 42 (not shown) may be opened to access the control box 130. The control box cover 154 can be opened by disengaging the fastener(s) 172 and pulling the control box cover 154 forward about one or more hinges 212, 214 that may be located proximal a bottom end 156 of the control box 130. The distribution lines 178, 180 can be inserted through the opening 192 in the back wall 36 of the generator enclosure 22 and the opening 176 in the back panel 146 of the control box 130.

A person standing behind the standby generator 20 may reach over the back wall 36 and into a top 170 entrance of the control box 130 to couple the distribution lines 178, 180 to the distribution line connectors 218, 220. The distribution lines 178, 180 can be coupled to the distribution line connectors 218, 220 by inserting the distribution lines through openings 276 in the connector blocks 272, 274 and tightening the set screws 280 to secure the distribution lines 178, 180 in the connector blocks 272, 274. The connector blocks 272, 274 can be coupled to the connector base 238 of each distribution line connector 218, 220 either before or after the distribution lines 178, 180 are inserted into the blocks, and either before or after the set screws 280 are tightened.

Alternatively, the person could move to the front of the generator enclosure 22 after inserting the distribution lines 178, 180 into the control box 130 to connect the distribution lines 178, 180 to the distribution line connectors 218, 220 through the front 158 or top 170 entrance into the control box 130. The distribution lines 178, 180 can be coupled to terminals 294, 296 of the circuit breakers 188, 190. The distribution lines 182, 184 from the alternator 122 can be inserted into the control box 130 through an opening 174 in the bottom panel 152 and connected to terminals 298, 300 of the circuit breakers 188, 190. The control box cover 154 can then be moved to the closed position and fastener(s) 172 secured.

Figure 7:
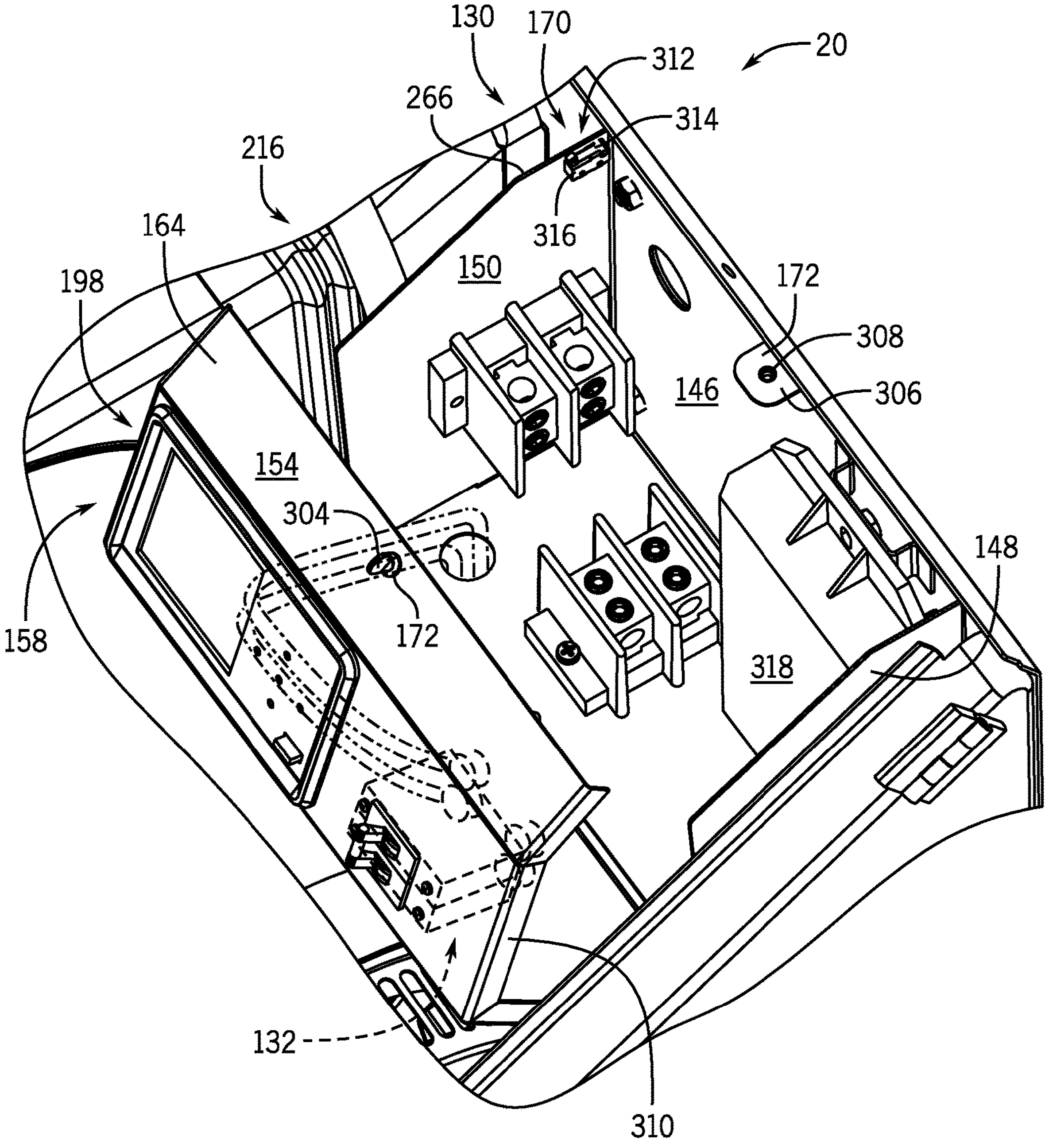
FIG. 7 is a detail view of a portion of the generator of FIG. 1 with a right door hidden and taken about a control box with a cover of the control box in an open position showing distribution line connectors mounted in the control box, according to an embodiment of the invention.

Referring now to FIG. 7, a partial perspective view of the standby generator 20 shows the control box cover 154 in the open position 216, in accordance with an embodiment of the invention. At least one fastener 172 is shown affixed or mounted to one or more of the control box 130 and the control box cover 154. The fastener 172 may comprise a thumb screw 304, coupled to the top panel 164 of the control box cover 154. The fastener 172 may also include a tab 306 extending forward from the back panel 146 at a top portion of the control box 130 with a threaded opening 308 to receive the thumb screw 304. The fastener(s) 172 may secure the control box cover 154 over the front 158 and top 170 of the control box 130. FIG. 7 also shows the control box cover 154 having side edges 310 that extend over the right panel 148 and left panel 150 of the control box 130 when closed.

A microswitch 312 may couple to the control box cover 154 to electrically disengage at least one of the one or more generator control components 132 when the control box cover 154 is open. The microswitch 312 may be mounted to the control box 130 along the upper edge 266 of the left panel 150, but could be mounted to the right panel 148, back panel 146, or directly on the control box cover 154. The microswitch 312 may include a lever arm 314 with a bumper 316 that couples to the control box cover 154 when the cover is closed. That is, the control box cover 154 has a surface that presses down on the lever arm 314 via contact with the bumper 316 so that the switch 312 senses when the control box cover 154 is closed. In another embodiment, the switch 312 may couple to the control panel 198 (i.e. control box cover 154) to disengage electrical power to at least one of the one or more generator control components 132 when the control panel 198 is open.

FIG. 7 also shows an automatic voltage regulator (AVR) 318 mounted to the back panel 146 of the control box 130. The automatic voltage regulator 318 may comprise a generator control component 132 operated by the control panel 198 to regulate electrical power distributed from the standby generator 20.

Figure 8:
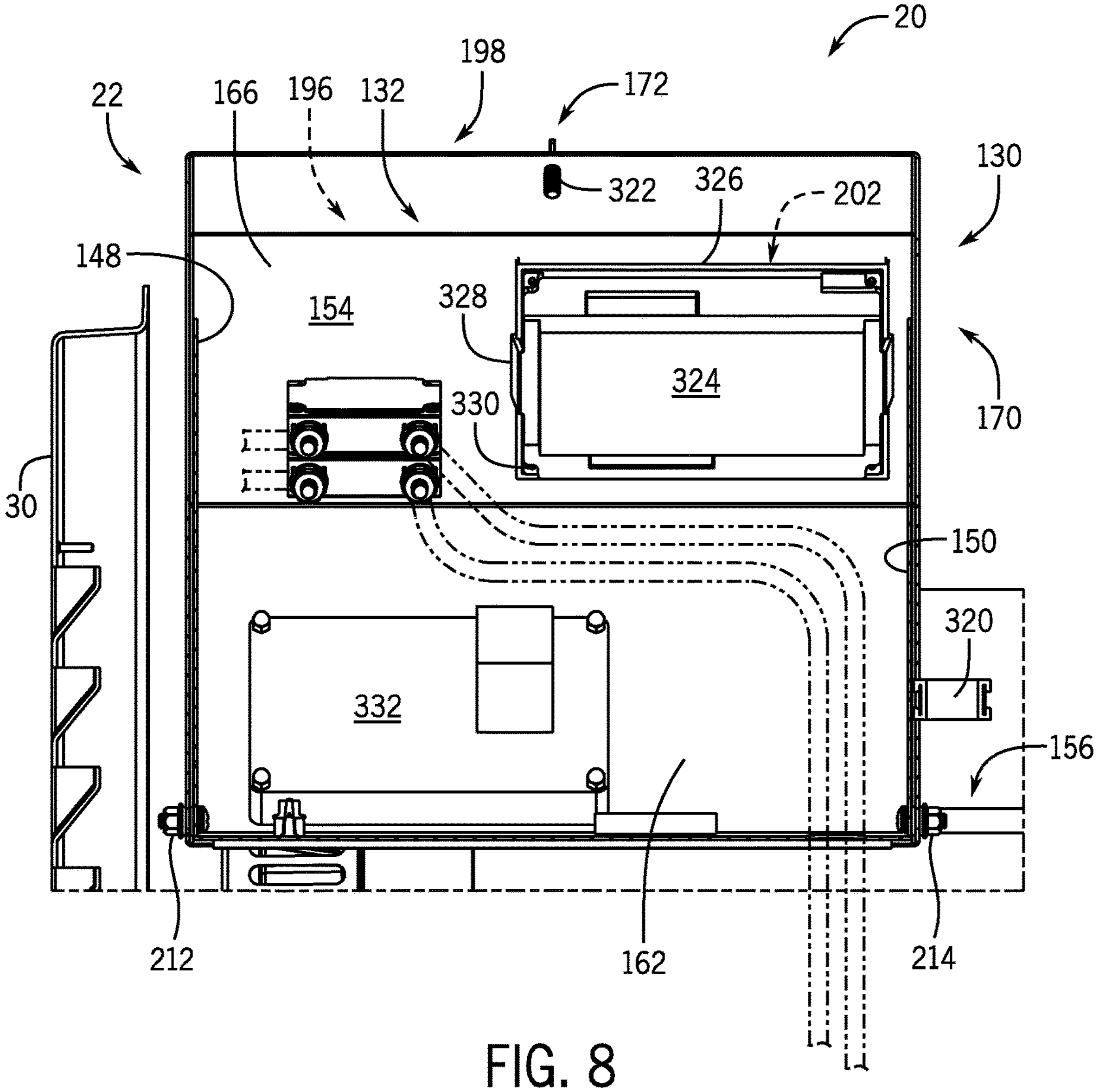
FIG. 8 is a detail partial cross-sectional view of the generator of FIG. 6 taken along line 8-8 of FIG. 6 showing a back side of a cover of a control box, according to an embodiment of the invention.

Referring now to FIG. 8, a detail partial cross-sectional view of the standby generator 20 taken along line 8-8 of FIG. 6 shows a back side of the control box cover 154, according to an embodiment of the invention. The left panel 150 of the control box 130 is shown coupled to a hose clamp 320 for a fuel line and the right panel 148 is shown adjacent the first sidewall 30 of the standby generator enclosure 22.

As previously set forth, the control panel 198 may couple to the control box 130 to open and provide selective access into the control box 130. The control panel 198 may rotate about the hinge(s) 212, 214 at a lower end 156 of the control panel 198 between a closed position covering the top 170 of the control box 130 and an open position uncovering the top 170 of the control box 130. One or more fasteners 172 may mount to the control panel 198 to selectively hold the control panel 198 closed. In one embodiment, the one or more fasteners 172 may comprise at least one of a Dzus fastener 322 and a thumb screw 304 (FIG. 7), or another turnlock fastener.

FIG. 8 shows a controller circuit board 324 mounted to the control box cover 154 on a back side of the intermediate panel 166. The controller circuit board 324 may be coupled to the display screen 202 extending through an opening surrounded by a rim 326 in the control box cover 154, with the rim 326 serving to hold the controller circuit board and the display screen. The controller circuit board 324 may have clips 328 that snap directly onto the rim 326, and openings for fasteners 330 to mount the display screen 202. The controller circuit board 324 may operate the control panel 198, for instance by operating generator control components 132 based on signals received from the display screen 202 or other generator controls 196 of the control panel 198. The controller circuit board 324 may also operate an engine controller 332 shown mounted to the control box cover 154 on the back side of the front panel 162. The engine controller 332 may be wired to the engine and controlled by the display screen 202.

Figure 9:
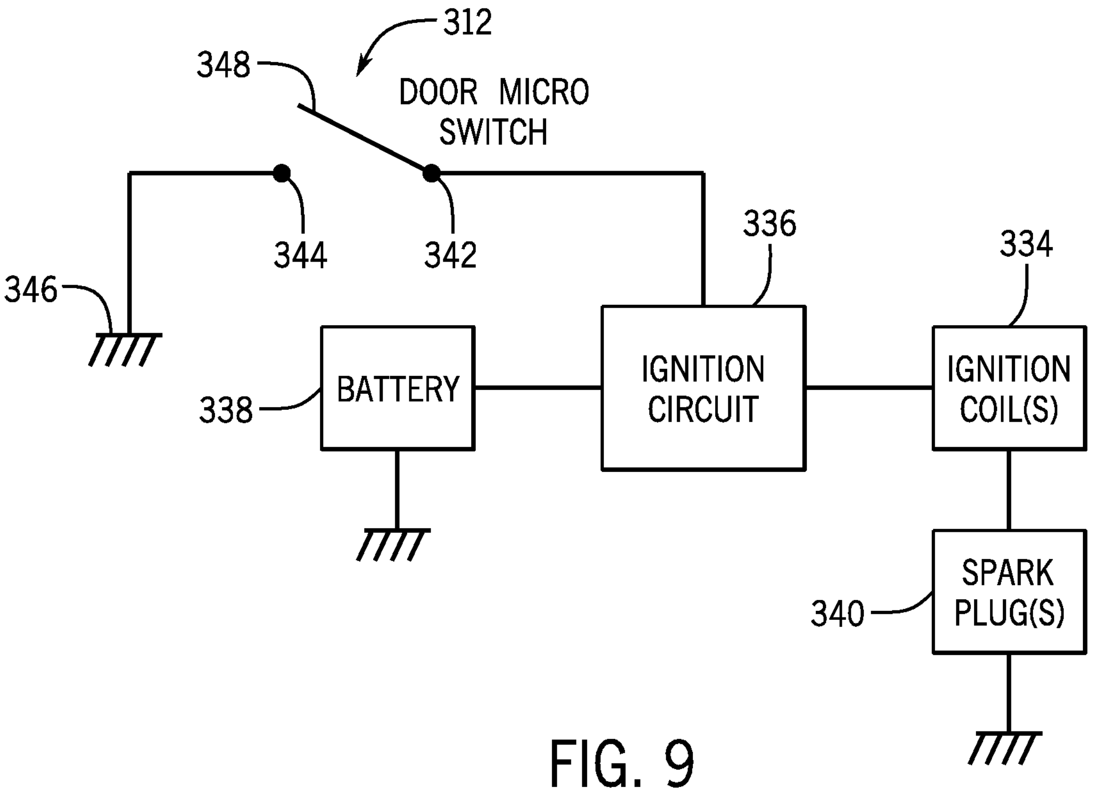
FIG. 9 is a diagram of an electrical circuit having a microswitch to interrupt electrical power to one or more generator components, according to an embodiment of the invention.

Referring now to FIG. 9 a diagram of an electrical circuit having the microswitch 312 is shown, in accordance with an embodiment of the invention. The microswitch 312 may be coupled to the control box 130 (FIGS. 2-8) to sense when the control box cover is open and automatically interrupt electrical power to one or more electrical components of the generator in response to an open cover. For instance, the microswitch 312 may automatically shut off the engine to stop electrical power generation from the alternator, and therefore distribution lines exposed by the open cover will not be powered. Thus, the microswitch 312 can improve generator safety by protecting people from electrical shock when the control box cover is open.

In one embodiment of the invention, the microswitch 312 may be wired to interrupt power to one or more ignition coils 334 for one or more cylinders of the engine. The microswitch 312 may be coupled to an ignition circuit 336 which provides power from a battery 338 to the ignition coil(s) 334. The ignition coil(s) 334 power spark plug(s) 340 to initiate spark ignition of combustible fuel in the cylinder(s). The microswitch 312 may include a first contact 342 wired to the ignition circuit 336 and a second contact 344 wired to a ground terminal 346. The microswitch 312 may include an actuator 348 that selectively couples the first contact 342 to the second contact 344 to complete an electrical circuit from the ignition circuit 336 to the ground terminal 346. The ignition circuit 336 may sense actuation of the microswitch 312 to control electrical power delivered to the ignition coil(s) 334.

The microswitch 312 may be normally open to interrupt an electrical circuit between the ignition circuit 336 and the ground terminal 346 when the control box cover is open. When the control box cover closes, the control box cover may close the microswitch 312 so that a current can flow from the ignition circuit 336 to the ground terminal 346. That is, the control box cover closes on the actuator 348 causing the actuator to electrically couple the first contact 342 to the second contact 344. The ignition circuit 336 may be programmed to provide power to the ignition coil(s) 334 in response to sensing the current flowing to the microswitch 312. When the control box cover is open, the ignition circuit 336 may sense an interruption in current to the microswitch 312 to stop providing power to the ignition coils 334. When power is not provided to the ignition coil(s) 334, the spark plug(s) 340 stop firing, the engine shuts down, and the alternator stops generating electricity.

Beneficially, embodiments of the invention provide a control system for a standby generator having a multi-chamber generator housing. The control system may include a control box mounted proximal a back wall of the multi-chamber generator housing to receive one or more power distribution lines extending through an opening in the back wall and an opening in the control box to couple with one or more distribution line connectors in the control box. The control box may include a control box cover having one or more generator controls thereon and that opens to expose a front and a top entrance into the control box. The control box cover may be hinged to one or more of a bottom panel and a plurality of side panels of the control box to rotate between an open position and a closed position providing selective access into the control box. The multi-chamber generator housing may include a first door and a second door that allow installation of one or more power distribution lines from a top entrance of the generator when the first and second doors are open and the control box cover is open. A switch may be mounted to sense an open control box cover and disable one or more generator control components of the control box.

Therefore, according to one embodiment of the invention, a control system for a standby generator includes a control box mounted in a standby generator enclosure with a control panel coupled to the control box that is selectively openable to provide access into the control box. One or more fasteners may be mounted to the control panel to selectively hold the control panel closed, and one or more generator control components may be mounted in the control box and operated by the control panel.

According to another embodiment of the invention, an electrical enclosure that houses one or more generator control components of a generator includes a plurality of side panels, a bottom panel coupled to the plurality of side panels, and an enclosure cover hinged to one or more of the bottom panel and plurality of side panels. The enclosure cover rotates between an open position and a closed position, so as to provide selective access to an interior of the electrical enclosure. A microswitch preferably couples to the enclosure cover to electrically disengage at least one of the one or more generator control components when the enclosure cover is in the open position.

According to yet another embodiment of the invention, a standby generator includes a standby generator enclosure having a base, a back wall extending generally vertically from the base, and first and second sidewalls each extending generally vertically from opposite ends of the base. The standby generator also includes an engine-generator set mounted to the base, and a control system to control operation of the engine-generator set that mounts proximate the back wall within the standby generator enclosure. The control system includes a control box that houses generator control components therein, and a control box cover hinged to the control box to rotate between a closed position and an open position. The control box cover may cover a top portion of the control box when in the closed position and uncover the top portion when in the open position, so as to provide selective access into the control box.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A control system for a standby generator comprising:
a control box mountable in a standby generator enclosure;
a control panel coupled to the control box and that is selectively openable to provide access into the control box;
one or more fasteners mounted to the control panel to selectively hold the control panel closed; and
one or more generator control components mounted in the control box and operated by the control panel.

2. The control system of claim 1 further comprising a hinge coupling the control panel to the control box at a lower end of the control panel; and
wherein the one or more fasteners secure the control panel over a front and a top of the control box.

3. The control system of claim 2 wherein the control panel rotates about the hinge between a closed position covering the top of the control box and an open position uncovering the top of the control box.

4. The control system of claim 3 wherein the hinge is located proximal a bottom end of the control box.

5. The control system of claim 1 wherein the control box has one or more openings formed therein to accept one or more power distribution lines therethrough.

6. The control system of claim 5 further comprising one or more power distribution connectors mounted in the control box to connect the one or more power distribution lines.

7. The control system of claim 5 further comprising a circuit breaker mounted in the control box and coupled to at least one of the one or more power distribution lines.

8. The control system of claim 7 wherein the circuit breaker comprises an operator switch located on an external surface of the control panel.

9. The control system of claim 1 wherein the one or more fasteners comprises at least one of a thumb screw and a Dzus fastener.

10. The control system of claim 1 wherein the standby generator enclosure comprises a multi-chamber standby generator housing that houses therein an engine coupled to drive a generator, with the engine and generator positioned in separate chambers of the multi-chamber standby generator housing; and wherein the control box is mounted to the multi-chamber standby generator housing.

11. The control system of claim 1 further comprising a switch coupled to the control panel to disengage electrical power to at least one of the one or more generator control components when the control panel is open.

12. An electrical enclosure that houses one or more generator control components of a generator, the electrical enclosure comprising:

a plurality of side panels;

a bottom panel coupled to the plurality of side panels;

an enclosure cover hinged to one or more of the bottom panel and plurality of side panels to rotate between an open position and a closed position, so as to provide selective access to an interior of the electrical enclosure; and a microswitch coupled to the enclosure cover to electrically disengage at least one of the one or more generator control components when the enclosure cover is in the open position.

13. The electrical enclosure of claim 12 wherein the enclosure cover is hinged to a lower end of the electrical enclosure and covers a side and a top of the electrical enclosure when in the closed position.

14. The electrical enclosure of claim 13 wherein the enclosure cover comprises an outer surface having mounted thereto:

generator controls for operating at least one of the one or more generator control components; and a feedback system to display generator operating parameters.

15. The electrical enclosure of claim 12 wherein the electrical enclosure further comprises:

a back cover having one or more openings formed therein to accept a power distribution line therethrough, and one or more power distribution connectors mounted within the electrical enclosure to connect the power distribution line to the generator.

16. The electrical enclosure of claim 15 further comprising a circuit breaker mounted within the electrical enclosure to break a circuit of the power distribution line.

17. The electrical enclosure of claim 12 mounted in a multi-chamber generator housing having an engine, a muffler operatively coupled to the engine, and an alternator driven by the engine positioned in the housing; and wherein the alternator and the muffler are positioned in separate chambers of the multi-chamber generator housing.

18. A standby generator comprising:

a standby generator enclosure comprising:

a base;

a back wall extending generally vertically from the base; and first and second sidewalls each extending generally vertically from opposite ends of the base;

an engine-generator set mounted to the base; and a control system to control operation of the engine-generator set and that is mounted proximate the back wall within the standby generator enclosure, the control system comprising:

a control box that houses generator control components therein; and a control box cover hinged to the control box to rotate between a closed position and an open position, the control box cover covering a top portion of the control box when in the closed position and uncovering the top portion when in the open position, so as to provide selective access into the control box.

19. The standby generator of claim 18 wherein the standby generator enclosure further comprises a first door and a second door, the first door being hinged to the enclosure to rotate over a top of the first sidewall and the second door being hinged to the enclosure to rotate over a top of the second sidewall; and wherein the first door and the second door allow access to the control system from a top of the standby generator when rotated to an open position.

20. The standby generator of claim 18 wherein the control box cover comprises standby generator controls.

21. The standby generator of claim 18 wherein the control box cover covers a front of the control box opposite the back wall when in the closed position and is hinged to a lower end of the control box.

22. The standby generator of claim 18 further comprising a switch mounted to one of the control box and the control box cover, the switch configured to:

sense when the control box cover is in the open position; and disable one or more of the generator control components when the control box cover is in the open position.

23. The standby generator of claim 18 wherein the back wall and the control box include an opening formed therein, the opening in the back wall and the control box configured to receive a distribution line therethrough that receives power from the engine-generator set.

24. The standby generator of claim 23 wherein the control box further comprises one or more distribution line connectors mounted therein to connect the distribution line to the engine-generator set.

25. The standby generator of claim 23 further comprising a circuit breaker operatively coupled to the distribution line within the control box, the circuit breaker having an operator switch on an outer surface of the control box.

26. The standby generator of claim 18 further comprising at least one fastener affixed to one or more of the control box and the control box cover to hold the control box cover in the closed position, the at least one fastener constructed to enable tool-less actuation thereof to provide access to the generator control components.

* * * * *